US008682604B2

(12) United States Patent
Fan (10) Patent No.: US 8,682,604 B2
(45) Date of Patent: Mar. 25, 2014

(54) METHOD AND SYSTEM OF PHASE IDENTIFICATION

(75) Inventor: Hua Fan, Norcross, GA (US)

(73) Assignee: General Electric Company, Schenectady, NY (US)

(*) Notice: Subject to any disclaimer, the term of this patent is extended or adjusted under 35 U.S.C. 154(b) by 400 days.

(21) Appl. No.: 13/197,117

(22) Filed: Aug. 3, 2011

(65) Prior Publication Data

US 2013/0035887 A1    Feb. 7, 2013

(51) Int. Cl.
*G06F 19/00* (2011.01)

(52) U.S. Cl.
USPC ............................................................ 702/72

(58) Field of Classification Search
USPC ............................................................ 702/72
See application file for complete search history.

(56) References Cited

U.S. PATENT DOCUMENTS

| | | | |
|---|---|---|---|
| 4,471,232 A | 9/1984 | Peddie et al. | |
| 5,243,225 A | 9/1993 | Schweer et al. | |
| 5,510,700 A | 4/1996 | Pomatto | |
| 5,548,207 A | 8/1996 | Smith | |
| 6,094,622 A | 7/2000 | Hubbard et al. | |
| 6,414,455 B1 * | 7/2002 | Watson | 318/432 |
| 7,031,859 B2 | 4/2006 | Piesinger | |
| 7,054,770 B2 | 5/2006 | Swarztrauber et al. | |
| 7,304,467 B2 | 12/2007 | Grno | |
| 7,372,246 B2 | 5/2008 | Marsden et al. | |
| 7,860,672 B2 | 12/2010 | Richeson et al. | |
| 8,050,879 B2 | 11/2011 | Koste et al. | |
| 2011/0161022 A1 | 6/2011 | Caird | |
| 2011/0285382 A1 | 11/2011 | Kolwalkar et al. | |

FOREIGN PATENT DOCUMENTS

| | | |
|---|---|---|
| DE | 196 21 543 A1 | 12/1997 |
| EP | 2204658 A1 | 7/2010 |
| JP | 6115371 | 7/1986 |
| JP | 2000055961 | 2/2000 |
| JP | 2001133497 | 5/2001 |
| WO | 2009017328 A2 | 2/2009 |
| WO | 2009057164 A1 | 5/2009 |

OTHER PUBLICATIONS

Office Action issued in connection with NZ Application No. 601460, Aug. 1, 2012.

* cited by examiner

*Primary Examiner* — Bryan Bui
(74) *Attorney, Agent, or Firm* — Fletcher Yoder, P.C.

(57) ABSTRACT

Described herein are embodiments of methods and systems of phase identification. One embodiment of the method comprises adjusting one or more operational characteristics of an electrical device; receiving information about changes in at least one electrical parameter of one or more phases of a poly-phase electrical system that provides electrical energy to the electrical device; correlating the changes in the at least one electrical parameter of the one or more phases of the poly-phase electrical system that provides electrical energy to the electrical device with the adjustment of the one or more operational characteristics of the electrical device; and identifying the one or more phases of the poly-phase electrical system that provide electrical energy to the electrical device based upon the correlation of the changes in the at least one electrical parameter of the one or more phases of the poly-phase electrical system that provides electrical energy to the electrical device with the adjustment of the one or more operational characteristics of the electrical device.

32 Claims, 7 Drawing Sheets

METHOD AND SYSTEM OF PHASE IDENTIFICATION

BACKGROUND OF THE INVENTION

In many instances, utility providers desire to know which phase or phases of a poly-phase electrical system the load is connected, or which phase or phases a load control relay is connected. One challenge faced by the utilities is that the records are incomplete or inaccurate that indicate to a meter installer which phase an individual customer is connected. Therefore, in order to accurately identify the current phase of a particular feeder branch, utility company personnel must physically trace a cable run back through various distribution facilities until they reach a point in the distribution network at which the phase is definitively known. This can be a very time-consuming and labor-intensive process, which can often lead to incorrect information. During storms or emergencies this can also lead to safety issues as well. When a utility performs various operations such as load profiling, analyzing power quality, loading of each phase, distribution system planning, and the like, it is important to know on which phase or phases the smart meters are connected so that analysis can be done with respect to each phase.

Therefore, systems and methods are desired that provide phase identification that overcome challenges present in the art, some of which are described above.

BRIEF DESCRIPTION OF THE INVENTION

Described herein are embodiments of methods and systems for phase identification.

One aspect comprises a method of phase identification. One embodiment of the method comprises adjusting one or more operational characteristics of an electrical device; receiving information about changes in at least one electrical parameter of one or more phases of a poly-phase electrical system that provides electrical energy to the electrical device; correlating the changes in the at least one electrical parameter of the one or more phases of the poly-phase electrical system that provides electrical energy to the electrical device with the adjustment of the one or more operational characteristics of the electrical device; and identifying the one or more phases of the poly-phase electrical system that provide electrical energy to the electrical device based upon the correlation of the changes in the at least one electrical parameter of the one or more phases of the poly-phase electrical system that provides electrical energy to the electrical device with the adjustment of the one or more operational characteristics of the electrical device.

In another aspect, a system is described. One embodiment of the system is comprised of a processor, wherein the processor is configured to: cause a signal to be transmitted to adjust one or more operational characteristics of an electrical device; receive information about changes in at least one electrical parameter of one or more phases of a poly-phase electrical system that provides electrical energy to the electrical device; correlate the changes in the at least one electrical parameter of the one or more phases of the poly-phase electrical system that provides electrical energy to the electrical device with the adjustment of the one or more operational characteristics of the electrical device; and identify the one or more phases of the poly-phase electrical system that provide electrical energy to the electrical device based upon the correlation of the changes in the at least one electrical parameter of the one or more phases of the poly-phase electrical system that provides electrical energy to the electrical device with the adjustment of the one or more operational characteristics of the electrical device.

Additional advantages will be set forth in part in the description which follows or may be learned by practice. The advantages will be realized and attained by means of the elements and combinations particularly pointed out in the appended claims. It is to be understood that both the foregoing general description and the following detailed description are exemplary and explanatory only and are not restrictive, as claimed.

BRIEF DESCRIPTION OF THE DRAWINGS

The accompanying drawings, which are incorporated in and constitute a part of this specification, illustrate embodiments and together with the description, serve to explain the principles of the methods and systems.

DETAILED DESCRIPTION OF THE INVENTION

Before the present methods and systems are disclosed and described, it is to be understood that the methods and systems are not limited to specific synthetic methods, specific components, or to particular compositions. It is also to be understood that the terminology used herein is for the purpose of describing particular embodiments only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the Examples included therein and to the Figures and their previous and following description.

Figure 1A:
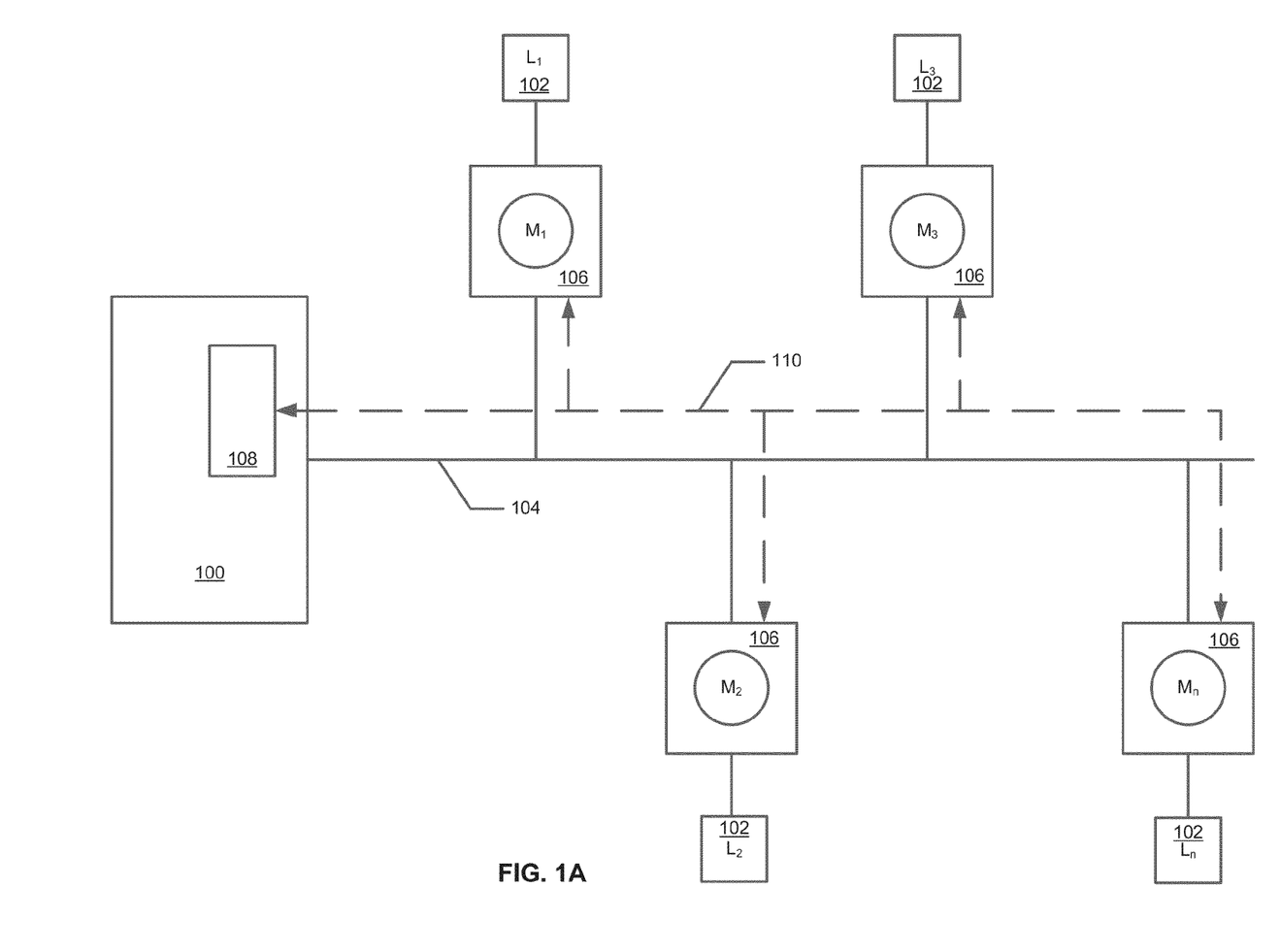
FIG. 1A is a single-line block diagram of a section of an exemplary utility distribution system.

Referring to FIG. 1A, an illustration of one type of system that would benefit from embodiments of the present invention is provided. FIG. 1A is a single-line block diagram of a section of an exemplary utility distribution system such as, for example, an electric distribution system. As shown in FIG. 1A, a utility service is delivered by a utility provider 100 to various loads $L_1$-$L_n$ 102 through a distribution system 104. In one aspect, the utility service provided can be electric power. Though shown in FIG. 1A as a single-line diagram, it is to be appreciated that the distribution system 104 can be comprised of single-phase and/or poly-phase components and be of varying voltage levels. Consumption and demand by the loads 102 can be measured at the load locations by meters $M_1$-$M_n$ 106. If an electric meter, the meters 106 can be single-phase or poly-phase electric meters, as known to one of ordinary skill in the art, depending upon the load 102. For example, the load can be single-phase and therefore the meter 106 can be single phase. Single-phase loads can be connected to different phases (e.g., phase A, phase B or phase C) of the distribution system 104. Similarly, for example, the load 102 can be a poly-phase load such as a three-phase load and the meter 106 can be a three-phase meter that meters the three phases serving the load 102.

In one aspect, the electric meter 106 is a smart meter as described herein and as known to one of ordinary skill in the art. Hereinafter, the specification will refer to the meter 106 as a "meter," "electric meter," and/or "smart meter," where the terms can be used interchangeably. One non-limiting example of a smart meter is the GE I210+c meter as available from General Electric Company ("GE") (Schenectady, N.Y.). Another non-limiting example of a smart meter is the GE SM3000 meter as also available from GE. While consumption or demand information is used by the utility provider 100 primarily for billing the consumer, it also can be used for other purposes including planning and profiling the utility distribution system. In some instances, utility providers 100 desire to electronically communicate with the meters 106 for numerous purposes including scheduling disconnection or connection of utility services to the loads 102, automatic meter reading (AMR), load shedding and load control, automatic distribution and smart-grid applications, outage reporting, providing additional services such as Internet, video, and audio, etc. In many of these instances, the meters 106 must be configured to communicate with one or more computing devices 108 through a communications network 110, which can be wired, wireless or a combination of wired and wireless, as known to one of ordinary skill in the art. In one aspect, the network 110 is an advanced metering infrastructure (AMI) network. AMI refers to systems that measure, collect and analyze energy usage, and interact with advanced devices such as electricity meters, gas meters, water meters, and the like through various communication media either on request (on-demand) or on pre-defined schedules. This infrastructure includes hardware, software, communications, consumer energy displays and controllers, customer associated systems, meter data management (MDM) software, supplier and network distribution business systems, and the like. The network 110 between the measurement devices (e.g., meters 106) and business systems allows collection and distribution of information to customers, suppliers, utility companies and service providers. This enables these businesses to either participate in, or provide, demand response solutions, products and services. By providing information to customers, the system assists a change in energy usage from their normal consumption patterns, either in response to changes in price or as incentives designed to encourage lower energy usage use at times of peak-demand periods or higher wholesale prices or during periods of low operational systems reliability. In one aspect, the network 110 comprises at least a portion of a smart grid network. In one aspect, the network 110 utilizes one or more of one or more of a WPAN (e.g., ZigBee, Bluetooth), LAN/WLAN (e.g., 802.11n, microwave, laser, etc.), WMAN (e.g., WiMAX, etc.), WAN/WWAN (e.g., UMTS, GPRS, EDGE, CDMA, GSM, CDPD, Mobitex, HSDPA, HSUPA, 3G, etc.), RS232, USB, Firewire, Ethernet, wireless USB, cellular, OpenHAN, power line carrier (PLC), broadband over power lines (BPL), and the like.

In some instances, the utility 100 desires to communicate with one or more electrical devices 102 at a metered location. In one aspect, the network 110 can be used by the utility to communicate with the one or more electrical devices 102. For example, a utility may desire to control operational characteristics of loads (e.g. electrical devices) 102 by use of a demand response management system (DRMS). An exemplary DRMS can be implemented through the use of dedicated control systems to shed loads in response to a request by a utility 100 or based upon market price conditions. Services (e.g., lights, machines, air conditioning, etc.) can be reduced according to a preplanned load prioritization scheme during the critical time frames. Generally, a DRMS can control or affect the operational characteristics of one or more electrical devices 102 found at a metered location. Such electrical devices can include, for example, one or more of a heating, ventilation and air conditioning (HVAC) unit, a water heater, lighting, a dish washer, a refrigerator, a washing machine, a dryer, an electric stove or oven, a microwave oven, and the like. In various instances, the utility 100 can communicate with the electrical devices 102 by use of network 110 that can comprise all or part of a DRMS, an AMI (as described herein), a smart-grid implementation, an Internet connection, or combinations thereof. The network 110 media can be wired (including fiber optic), wireless, or combinations thereof. In various aspects, the utility 100 can adjust operational characteristics of one or more electrical devices 100. For example, adjusting the one or more operational characteristics of the electrical device 102 can comprise causing the electrical device 102 to draw higher current or operate at a higher voltage than its normal operating state or can comprise causing the electrical device 102 to draw lower current or operate at a lower voltage than its normal operating state. In one aspect, adjusting the one or more operational characteristics of the electrical device 102 can comprise cycling the electrical device on and off. Such cycling can occur at a specified frequency. In one aspect, the network 110 communicates with a meter 106, such as a smart meter, which in turn communicates either wirelessly or through a wired connection with the one or more electrical devices at the metered location. In other instances, the network 110 can communicate directly with the one or more electrical devices using, for example, the Internet, cellular telephone, wired telephone connections, wired cable television connections, and the like.

Figure 1B:
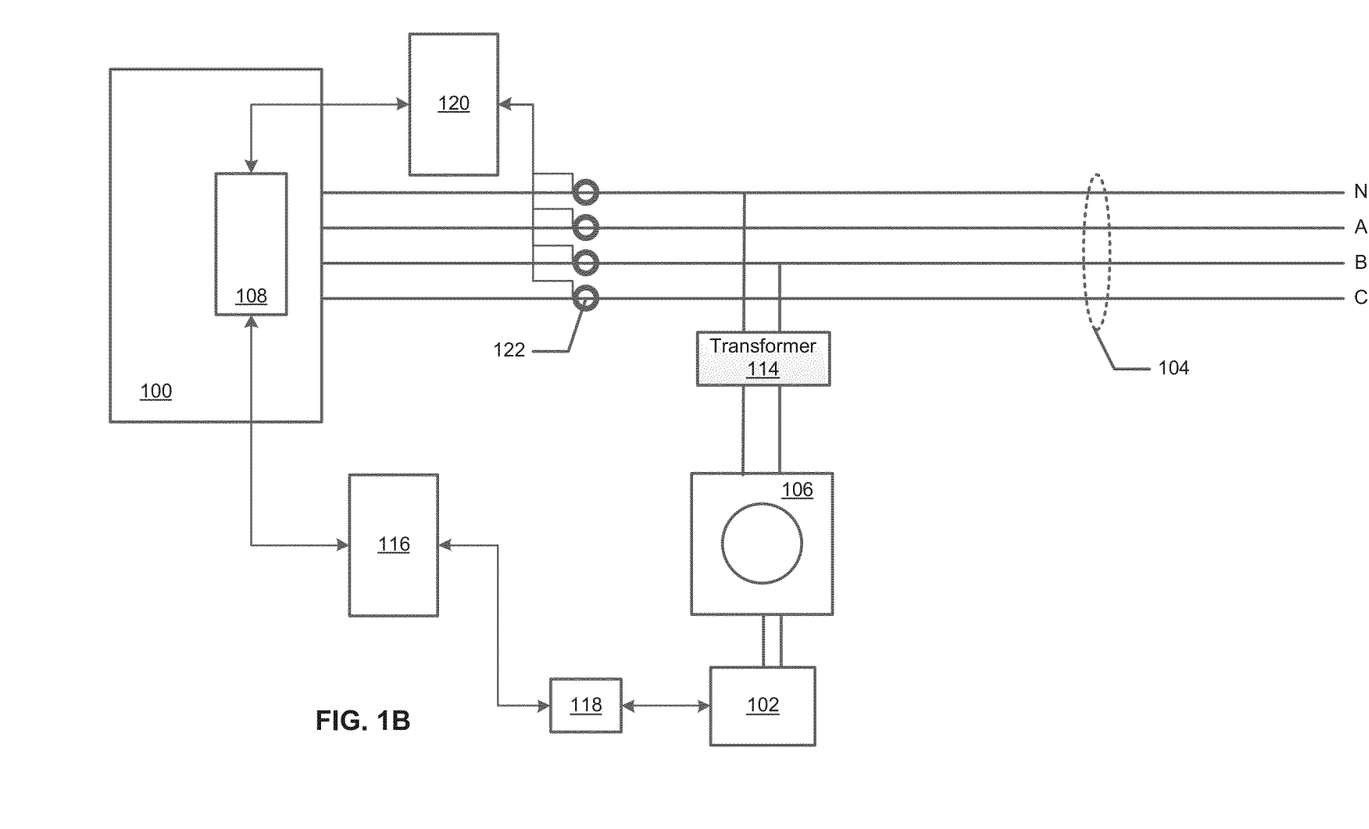
FIG. 1B is an exemplary detailed illustration of a portion of a three-phase, four-wire (phases A, B, C and neutral, N) distribution system according to one embodiment of the present invention.

Referring now to FIG. 1B, in some instances an electrical distribution system 104 may be a poly-phase system such as a three-phase, four-wire network, which supplies power-using feeders. Each of the feeder lines then branches into multiple circuits to power a plurality of local pole-mounted or pad-mounted transformers 114, which step the voltage down to final voltages of, for example, 120 or 240 volts phase-to-ground or phase-to-phase for delivery and metering at metered commercial and residential customer locations. Generally, residential customers can be connected to any one phase of the three-phase system using a single-phase meter and commercial customers can be connected to all the three phases using three-phase meter with a load control relay ("LCR") connected on any one of the phases. When a utility performs various operations such as load profiling, analyzing power quality, loading of each phase, etc., it is desired to know on which phase the meter 106 is connected so that the analysis can be performed with respect to each phase. FIG. 1B is an exemplary detailed illustration of a portion of a three-phase, four-wire (phases A, B, C and neutral, N) distribution system according to one embodiment of the present invention. As shown in FIG. 1B, distribution system 104 is comprised of three phase conductors (phases A, B and C) and a neutral (N) wire. In one aspect, each of three phases and the neutral are provided to each meter 106. In one aspect, the voltage provided at the meters 106 is stepped down by a transformer 114 to a level that can be used by the load 102 (e.g. 120/240, 277/480, and the like). The transformer 114 can be a single transformer, two or three single-phase transformers, or a single three-phase transformer, as needed to serve the load. FIG. 1B illustrates a single-phase load 102 served from phase B of the three-phase distribution system 104, though it is to be understood that embodiments of the present invention are equally applicable to poly-phase loads (and meters). As shown in FIG. 1B, an electrical device 102 has its operational characteristics adjusted through system 116. As noted above, adjusting the one or more operational characteristics of the electrical device 102 can comprise causing the electrical device 102 to draw higher current or operate at a higher voltage than its normal operating state or can comprise causing the electrical device 102 to draw lower current or operate at a lower voltage than its normal operating state. In one aspect, adjusting the one or more operational characteristics of the electrical device 102 can comprise cycling the electrical device on and off. Such cycling can occur at a specified frequency. Also, as noted herein, system 116 can comprise DRMS, an AMI, the Internet, combinations thereof and the like. Computing device 108, which is comprised of at least a processor, can be configured to cause a signal to be transmitted wherein the signal causes an adjustment of one or more of the operational characteristics of the electrical device 102. In one aspect, the signal is transmitted from the computing device 108 to the system 116. The system 116, in turn, causes an adjustment in the operational characteristics of the electrical device 102. In one aspect, the system causes a control 118 associated with the electrical device 102 to adjust one or more operational characteristics of the electrical device 102. The control 118 can be, for example, a switch, relays, a rheostat, an adjustable voltage divider, a speed controller, and the like. In another aspect, the signal is transmitted from the computing device 108 to a meter 106 associated with the electrical device 102, and the meter 106 then transmits a signal (wirelessly or over a wired connection) to the electrical device 102 or to the control 118 associated with the electrical device 102 thereby causing an adjustment of the operational characteristics of the electrical device 102. In another aspect (not shown), the meter 106, the electrical device 102, the control 118, or combinations thereof can be programmed to automatically adjust the operational characteristics of the electrical device 102 during a specified time period such as, for example, between 12:00 midnight and 4:00 a.m. each Monday morning. In one aspect, the electrical device control 118 can cause the electrical device 102 to draw higher current or operate at a higher voltage than its normal operating state or can cause the electrical device 102 to draw lower current or operate at a lower voltage than its normal operating state. In another aspect, the electrical device control 118 can cause the electrical device 102 to cycle on and off. In one aspect, the electrical device control 118 can be caused to adjust the one or more operational characteristics of the electrical device 102 in a cyclic or repetitive pattern such that at least one electrical parameter of the one or more phases of a poly-phase electrical system 104 that provides electrical energy to the electrical device 102 is affected by the adjustment of the one or more operational characteristics of the electrical device 102 and the at least one affected electrical parameter can be detected.

Further comprising the system shown in FIG. 1B is a monitoring system 120. Monitoring system 120 is comprised of at least one or more sensors 122, wherein the sensors 122 are configured to and capable of detecting a change in at least one electrical parameter of one or more phases of a poly-phase electrical system 104 that provides electrical energy to the electrical device 102. In one aspect, monitoring system 120 comprises all or a portion of a supervisory control and data acquisition (SCADA) system. In another aspect, monitoring system 120 comprises all or a portion of a distribution management system (DMS). In another aspect, monitoring system 120 is a combination of all or portions of a SCADA system and a DMS. In one aspect, monitoring system 120 has a separate computing device (e.g., a SCADA processor), while in other aspects monitoring system 120 makes use of computing device 108 (which can serve as a SCADA processor). Monitoring system 120 comprises a database 200 such as that shown in FIG. 2, wherein each sensor 120 is uniquely identified 202 and associated with a phase 204 of the poly-phase electrical system 104. In this manner, monitoring system 120 is capable of correlating any change detected in at least one electrical parameter of one or more phases of a poly-phase electrical system 104 that provides electrical energy to the electrical device 102 with the phase 204 or phases on which the change is detected. For example, if the sensor 122 associated with phase B detects a change in current in phase B, then monitoring system 120 is configured to associate the change in current with phase B (and not with phases A, C or neutral (N)). In various aspects, sensors 122 can detect changes in at least one of voltage, current, resistance, frequency, capacitance, inductance, power factor, real power, reactive power and the like of the one or more phases of the poly-phase electrical system 104 that provides electrical energy to the electrical device 102. In one aspect, monitoring system 120 can further analyze signals received from the sensors 122. For example, in one instance the monitoring system 120 can perform a fast-Fourier transform (FFT) of the sensor signals to detect the affected electrical parameters. In one aspect, such analysis can be performed on a processor such as SCADA processor or computing device 108 described herein. In other aspects, monitoring system 120 can perform other frequency- or time-domain analyses on the sensor signals.

Figure 2:
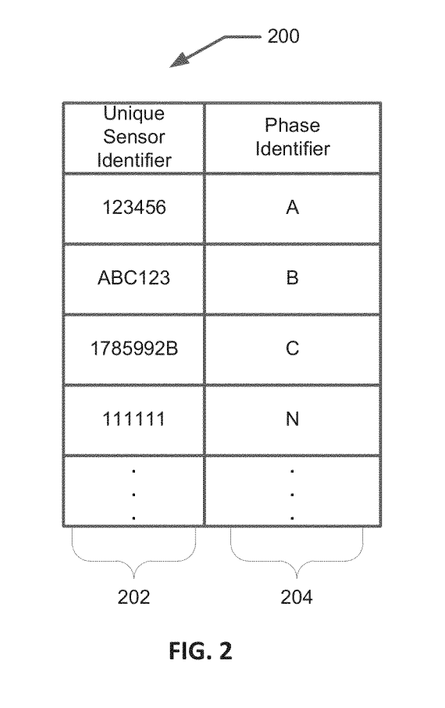
FIG. 2 illustrates an exemplary database, wherein each sensor is uniquely identified and associated with a phase of the poly-phase electrical system.
Figure 3:
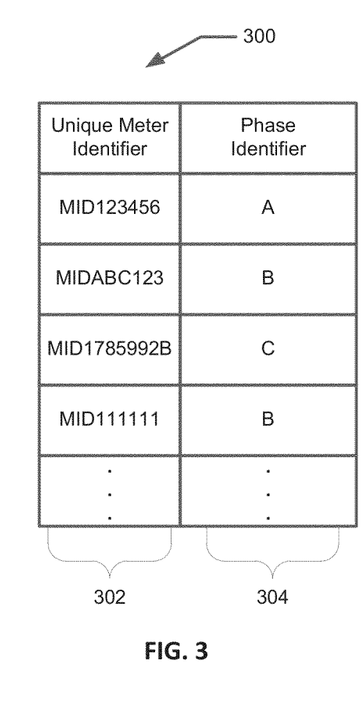
FIG. 3 illustrates an exemplary database, wherein a unique meter identifier is shown in one column and the electrical phase (or phases) that the meter having the unique identifier connected to is shown in a second column.

Referring back to FIG. 1B, computing device 108 receives from monitoring system 120 information about changes in at least one electrical parameter of one or more phases of the poly-phase electrical system 104 that provides electrical energy to the electrical device 102. The changes in the at least one electrical parameter of the one or more phases of the poly-phase electrical system 104 that provides electrical energy to the electrical device 102 are correlated with the adjustment of the one or more operational characteristics of the electrical device 102. In one aspect, this correlation is performed using computing device 108. For example, if electrical device 102 has its operational characteristics adjusted by turning the electrical device 102 on and off in a repetitive pattern or at a defined frequency, then sensors 122 can detect the changes in the electrical parameters (e.g., changes in at least one of voltage, current, resistance, frequency, capacitance, inductance, power factor, real power, reactive power and the like) of the one or more phases of the poly-phase electrical system 104 that provides electrical energy to the electrical device 102 and these changes in the electrical parameters can be correlated with the adjustment of the one or more operational characteristics of the electrical device 102. Because, as shown in FIG. 2, each sensor 122 is associated with a phase 204, the phase that the detected electrical parameter change occurred on can be determined. Therefore, by adjusting the operational characteristics of the electrical device 102 and then correlating changes in the electrical parameters of the one or more phases of the poly-phase electrical system 104 that provides electrical energy to the electrical device 102, the electrical phase (or phases) that the electrical device 102 is connected to can be identified. For example, if the sensor 122 attached to phase B detects the changes in the electrical parameters caused by adjusting the operational characteristics of the electrical device 102, then phase B can be identified as the electrical phase that provides electrical energy to the electrical device 102. Therefore, computing device 108 can identify the one or more phases of the poly-phase electrical system 104 that provide electrical energy to the electrical device 102 based upon the correlation of the changes in the at least one electrical parameter of the one or more phases of the poly-phase electrical system 104 that provides electrical energy to the electrical device 102 with the adjustment of the one or more operational characteristics of the electrical device 102. Therefore, it can be determined which phase of the poly-phase electrical system 104 meter 106 that serves electrical device 102 is connected to because meter 106 will be connected to the same phase that serves the electrical device 102. This information can be recorded in a database 300 such as the one shown in FIG. 3, where a unique meter identifier 302 is shown in one column and the electrical phase (or phases) 304 that the meter 106 having the unique identifier 302 is connected to is shown in a second column. This information provides a technical aspect of assigning a phase association with a newly installed meter 106, changing phases associations for a meter 106 when the meter 106 is moved from one phase to another, for load-balancing a poly-phase electric system 104, for load-profiling and load analysis studies of the poly-phase electric system 104, and the like. The information of database 300 can be stored in a memory associated with computing device 108, or stored in a memory associated with meter 106, or transferred to any other programs or devices where such information is desired. The phase identifier 304 can be read or written (depending on security) by a utility 100 using advanced communication techniques such as AMI, Optical, RF, WiMax, LAN/WAN, GSM, etc., and meter software (e.g., GE Meter Mate™ software). FIG. 3 represents a database 300 stored on a memory, wherein the processor of the computing device 108 is configured to associate the identified one or more phases 304 of the poly-phase electrical system 104 that provide electrical energy to the electrical device 102 to an electric meter identifier 302 that identifies an electric meter 106 used to meter electric energy consumption of the electrical device 102 and store the identified one or more phases 304 of the poly-phase electrical system 104 and the electric meter identifier 302 in the database 300.

In various aspects, the computing device 108 can be configured such that the one or more operational characteristics of the electrical device 102 during off-peak hours for the poly-phase electrical system 104 that provides electrical energy to the electrical device 102. Off-peak hours are generally considered those times when electrical consumption is lower and there are fewer variations in electrical consumption such that changes in the electrical parameters of the poly-phase electrical system 104 are more readily discernible. For example, the off-peak hours for the poly-phase electrical system 104 that provides electrical energy to the electrical device 102 may be between 12:00 midnight and 4:00 a.m., local to a location of the electrical device 102.

Figure 4:
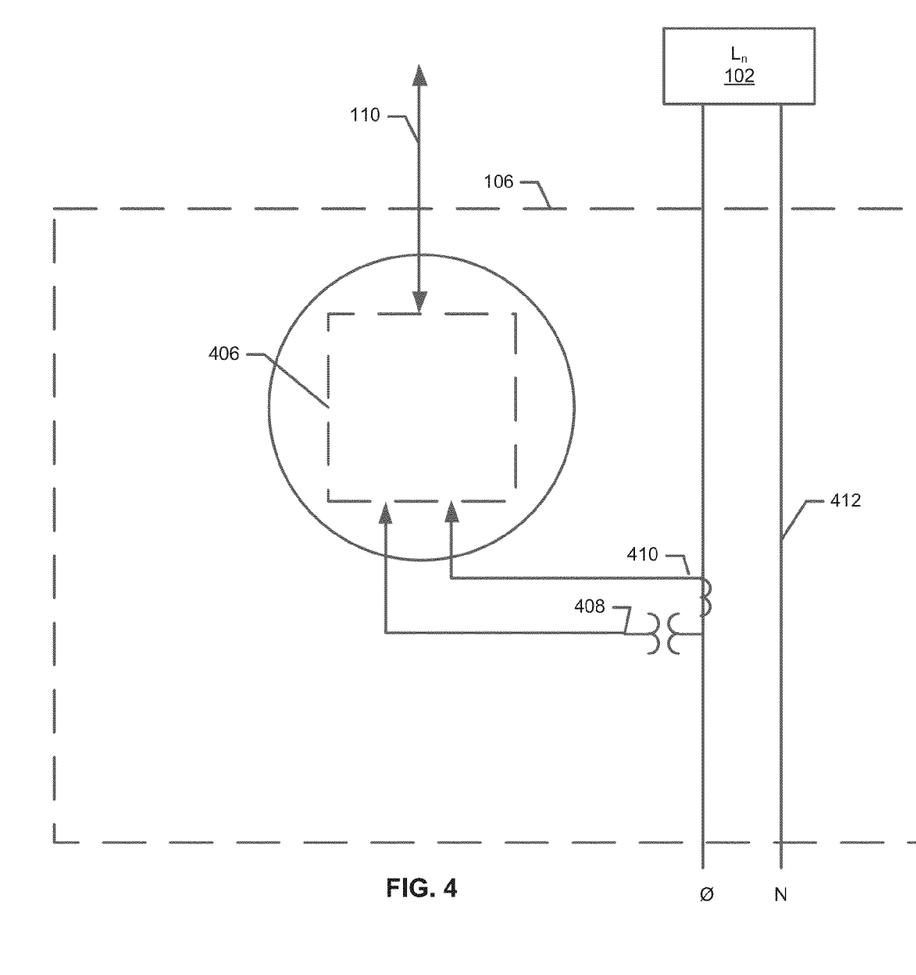
FIG. 4 illustrates an overview block diagram of a non-limiting embodiment of a meter that can be used to practice embodiments of the present invention.

FIG. 4 illustrates an overview block diagram of a non-limiting embodiment of a meter 106 that can be used to practice embodiments of the present invention. In this exemplary embodiment, the utility service is poly-phase electric power. Particularly, in FIG. 4 the electric service is three-phase, four-wire electric power generally comprised of three phase conductors each carrying electric voltage and current that is generally displaced from one another by 120 degrees (e.g., phases A, B and C) and a separate neutral wire. It is to be appreciated, however, that the embodiments of the invention can be used with single- and poly-phase electrical systems such as two-phase, three-phase, four-phase, etc. Further comprising the embodiment of a meter 106 shown in FIG. 4 are meter's electronics 406. Analog voltage and current inputs are provided to meter electronics 406. In one aspect, the analog signals are derived from the electrical power feed serving the load 102 and the one being metered by the meter 106. In another aspect, the analog signals are derived from a separate electrical source. In one aspect, the analog voltage signal can be provided by one or more potential transformers (PT) 408, if needed, though other means such as a voltage divider, capacitive coupling, or the like can be used. If the voltage level of the source is sufficiently low (e.g., 0.25 volts AC, or lower), then a PT 408 or other means of stepping down or transforming the voltage can be omitted. Similarly, in one aspect, the analog current signal can be provided by one or more current transformers (CT) 410. In one aspect, the one or more CTs 410 can have a turns ratio of 1:2500. In one aspect, one or more resistors (not shown) can be used to convert the current signal from the CT 410 into a voltage signal.

In one aspect, the meter electronics 406 can comprise a memory (not shown in FIG. 4). The memory can be used to store a phase identifier that indicates the phase of the poly-phase electrical system 104 that the load 102 (and meter 106) are connected. For example, if the electrical power feed serving the load 102 and the one being metered by the meter 106 is phase A, then the phase identifier stored in the memory indicates phase A. Similarly, if the electrical power feed switches from phase A to phase B, then the phase identifier stored in the memory can be updated to indicate phase B. In one aspect, the phase identifier is stored automatically when the power feed is switched from one phase to another (e.g., from phase A to phase B). For example, a signal can be sent to the meter 106 over a network 110. In one aspect, the network 110 is an advanced metering infrastructure (AMI) network. In another aspect, the phase identifier can be stored in the meter 106 manually by a user that has authorization to write to the memory using, for example, infrared, near-field communications such as BlueTooth, Wi-Fi, RF, RFID, and the like, or by connecting a device such as a computer to the meter 106 using a bus connection. In another aspect, the phase identifier can be communicated to the memory in the meter's electronics 406 via a network 110 that is operably connected with the meter's electronics 406. In one aspect, the network 110 is an advanced metering infrastructure (AMI) network. For example, if an entire circuit is switched, either automatically or manually, by a utility such that phase A becomes phase B or some other similar switching, then a signal can be sent to the meter's electronics 406 over the network to update the phase identifier such that indicates the meter 106 and the load 102 are connected to phase B. Once the phase identifier is stored in the memory, it can be transmitted over the network 110 to, for example, the computing device 108 or it can be read from the memory by a user with proper authorization and equipment.

Figure 5:
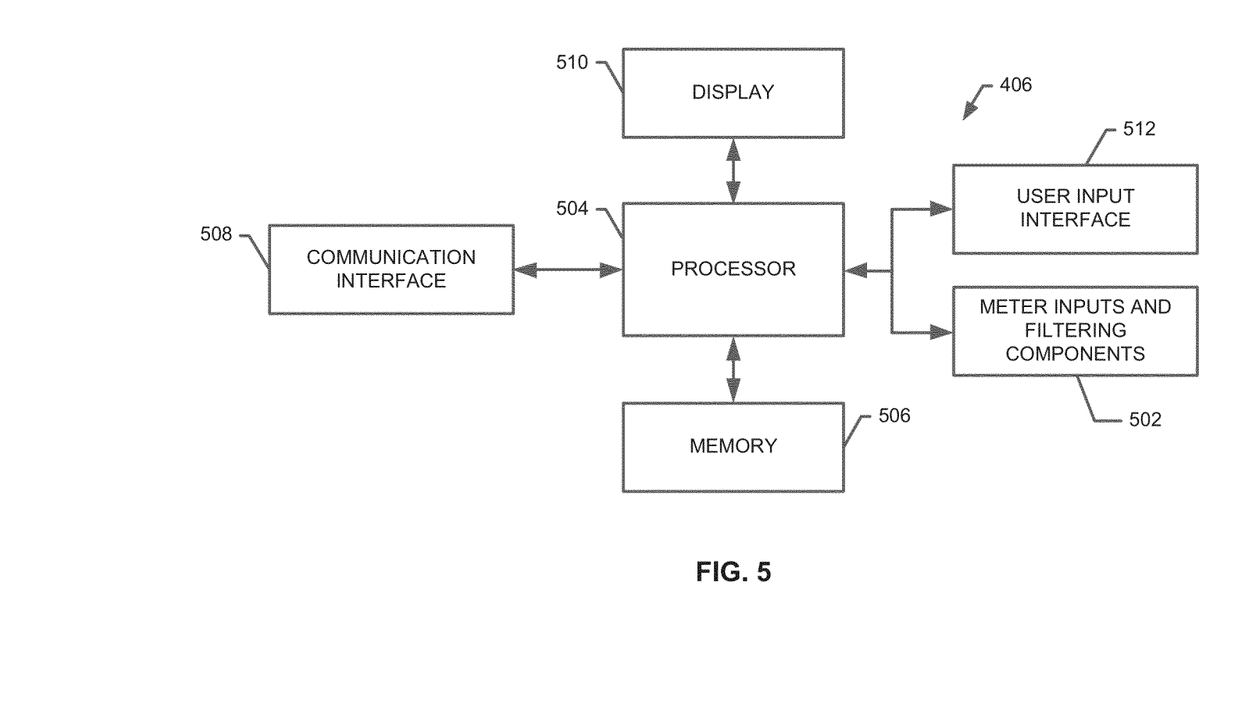
FIG. 5 illustrates a block diagram of an entity capable of operating as meter electronics in accordance with one embodiment of the present invention.

Referring now to FIG. 4, a block diagram of an entity capable of operating as meter electronics 406 is shown in accordance with one embodiment of the present invention. The entity capable of operating as a meter electronics 406 includes various means for performing one or more functions in accordance with embodiments of the present invention, including those more particularly shown and described herein. It should be understood, however, that one or more of the entities may include alternative means for performing one or more like functions, without departing from the spirit and scope of the present invention. As shown, the entity capable of operating as a meter electronics 406 can generally include means, such as one or more processors 504 for performing or controlling the various functions of the entity. As shown in FIG. 5, in one embodiment, meter electronics 406 can comprise metering components such as meter inputs and filtering components 502. In one aspect, the meter inputs and filter components 502 can comprise voltage and current inputs, one or more ADCs, filtering components, and the like. Further comprising this embodiment of meter electronics 406 are one or more processors 504 and memory 506.

In one embodiment, the one or more processors 504 are in communication with or include memory 506, such as volatile and/or non-volatile memory that stores content, data or the like. For example, the memory 506 may store content transmitted from, and/or received by, the entity. Also for example, the memory 506 may store software applications, instructions or the like for the one or more processors 504 to perform steps associated with operation of the entity in accordance with embodiments of the present invention. In one aspect, the meter electronics 406 comprise at least a memory, and one or more processors and provide an interface for receiving a signal from the network 110 and causing the electrical device control 118 to adjust the operational characteristics of the electrical device 102. The memory 506 of the meter electronics 406 can be used to store a phase identifier as described above. The meter electronics 406 can comprise a transmitter that can be used to transmit at least the phase identifier over the network 110 to a separate computing device 108. In one aspect, the meter's electronics 406 can comprise one or more metering micro-controllers including a Teridian 6533 controller or a Teridian 6521 controller as are available from Maxim Integrated Products, Inc. (Sunnyvale, Calif.), among others. In one aspect, the one or more processors 504 can perform metering functions such as determining the number of kilowatt-hours (KWH) of electricity consumed by the load 102.

In addition to the memory 506, the one or more processors 504 can also be connected to at least one interface or other means for displaying, transmitting and/or receiving data, content or the like. In this regard, the interface(s) can include at least one communication interface 508 or other means for transmitting and/or receiving data, content or the like, as well as at least one user interface that can include a display 510 and/or a user input interface 512. In one aspect, the communication interface 508 can be used to transfer a phase identifier stored in the memory 506 to a remote computing device such as the one described herein over a network 110. In one aspect, the network 110 is an advanced metering infrastructure (AMI) network. In one aspect, the communication interface 508 can comprise a wireless communication interface such as a Wi-Fi transceiver. The user input interface 512, in turn, can comprise any of a number of devices allowing the entity to receive data from a user, such as a keypad, a touch display, a joystick or other input device.

Figure 6:
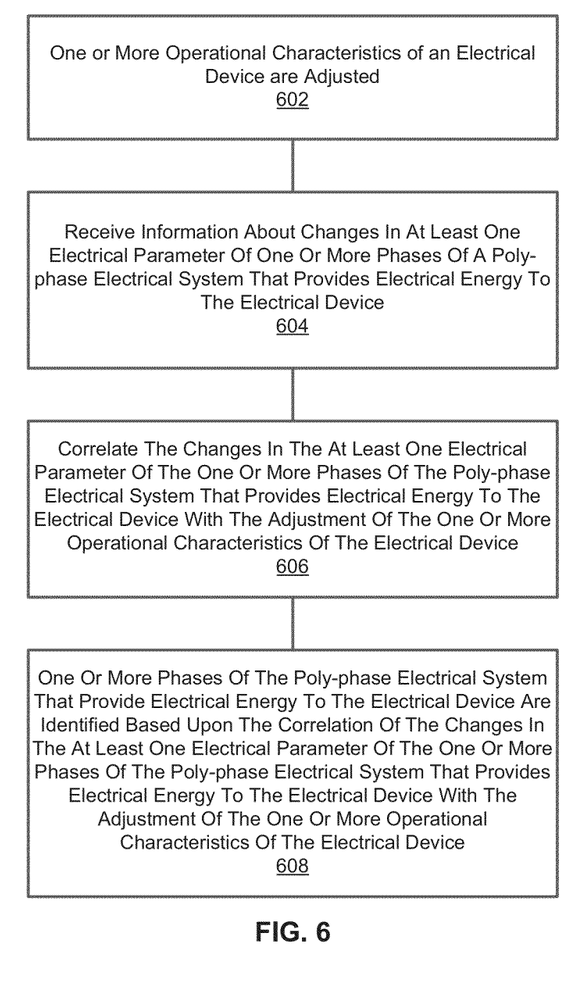
FIG. 6 is a flowchart illustrating the operations that may be taken for phase identification according to an embodiment of the present invention.

Referring now to FIG. 6, the operations are illustrated that may be taken for phase identification. At step 602, one or more operational characteristics of an electrical device are adjusted. In one aspect, the one or more operational characteristics of the electrical device are adjusted using one or more of a demand response management system (DRMS), an advanced metering infrastructures (AMI) system, or an Internet connection. In one aspect, adjusting the one or more operational characteristics of the electrical device comprises causing the electrical device to draw higher current or operate at a higher voltage than its normal operating state or comprises causing the electrical device to draw lower current or operate at a lower voltage than its normal operating state. In one aspect, adjusting the one or more operational characteristics of the electrical device comprises cycling the electrical device on and off. In one aspect, adjusting the one or more operational characteristics of the electrical device comprises adjusting the operational characteristics of one or more of a heating, ventilation and air conditioning (HVAC) unit, a water heater, lighting, a dish washer, a refrigerator, a washing machine, a dryer, an electric stove or oven, a microwave oven, and the like. In one aspect, adjusting the one or more operational characteristics of the electrical device comprises adjusting the one or more operational characteristics of the electrical device in a cyclic or repetitive pattern such that at least one electrical parameter of the one or more phases of a poly-phase electrical system that provides electrical energy to the electrical device is affected by the adjustment of the one or more operational characteristics of the electrical device and the at least one affected electrical parameter can be detected. In one aspect, adjusting the one or more operational characteristics of the electrical device is performed during off-peak hours for the poly-phase electrical system that provides electrical energy to the electrical device. In one aspect, the off-peak hours for the poly-phase electrical system that provides electrical energy to the electrical device are between 12:00 midnight and 4:00 a.m., local to a location of the electrical device.

At Step 604, information is received about changes in at least one electrical parameter of one or more phases of a poly-phase electrical system that provides electrical energy to the electrical device. In one aspect, receiving information about changes in at least one electrical parameter of one or more phases of a poly-phase electrical system that provides electrical energy to the electrical device comprises receiving information about changes in at least one of voltage, current, resistance, frequency, capacitance, inductance, power factor, real power, reactive power and the like of the one or more phases of the poly-phase electrical system that provides electrical energy to the electrical device. In one aspect, receiving information about changes in at least one electrical parameter of one or more phases of a poly-phase electrical system that provides electrical energy to the electrical device comprises receiving information from a supervisory control and data acquisition (SCADA) system. In one aspect, receiving information about changes in at least one electrical parameter of one or more phases of a poly-phase electrical system that provides electrical energy to the electrical device comprises receiving information about changes in at least one electrical parameter detected using a fast-Fourier transform (FFT) to detect the affected electrical parameters. In one aspect, receiving information about changes in at least one electrical parameter of one or more phases of a poly-phase electrical system that provides electrical energy to the electrical device comprises receiving information from a distribution management system (DMS). In one aspect, receiving information about changes in at least one electrical parameter of one or more phases of a poly-phase electrical system that provides electrical energy to the electrical device comprises receiving a respective phase identifier for each of the one or more phases of the poly-phase electrical system where a change in at least one electrical parameter is detected.

At Step 606, the changes in the at least one electrical parameter of the one or more phases of the poly-phase electrical system that provides electrical energy to the electrical device are correlated with the adjustment of the one or more operational characteristics of the electrical device. In one aspect, correlating the changes in the at least one electrical parameter of the one or more phases of the poly-phase electrical system that provides electrical energy to the electrical device with the adjustment of the one or more operational characteristics of the electrical device comprises detecting changes in at least one of voltage, current, resistance, frequency, capacitance, inductance, power factor, real power, reactive power, and the like of the one or more phases of the poly-phase electrical system that provides electrical energy to the electrical device, wherein the detected changes can be correlated with the adjustment of the one or more operational characteristics of the electrical device.

At Step 608, the one or more phases of the poly-phase electrical system that provide electrical energy to the electrical device are identified based upon the correlation of the changes in the at least one electrical parameter of the one or more phases of the poly-phase electrical system that provides electrical energy to the electrical device with the adjustment of the one or more operational characteristics of the electrical device. In one aspect, identifying the one or more phases of the poly-phase electrical system that provide electrical energy to the electrical device based upon the correlation of the changes in the at least one electrical parameter of the one or more phases of the poly-phase electrical system that provides electrical energy to the electrical device with the adjustment of the one or more operational characteristics of the electrical device comprises identifying the one or more phases of a three-phase electrical system that provide electrical energy to the electrical device based upon the correlation of the changes in the at least one electrical parameter of the one or more phases of the three-phase electrical system that provides electrical energy to the electrical device with the adjustment of the one or more operational characteristics of the electrical device.

In one aspect, the operations for phase identification in a smart meter as shown in FIG. 6 can further include the step of associating the identified one or more phases of the poly-phase electrical system that provide electrical energy to the electrical device to an electric meter associated with the electrical device.

Figure 7:
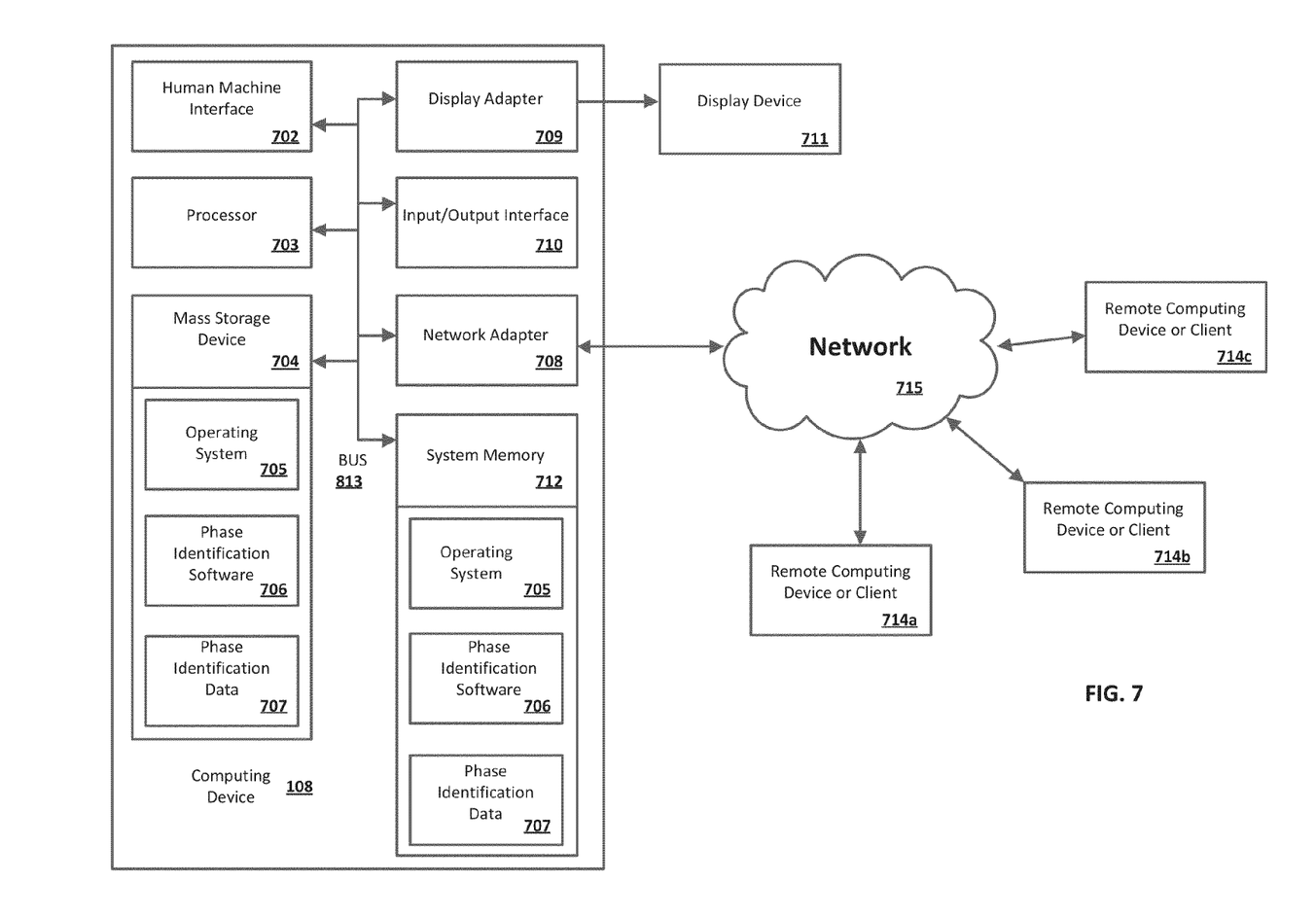
FIG. 7 is a block diagram illustrating an exemplary operating environment for performing the disclosed methods.

The above system has been described above as comprised of units. One skilled in the art will appreciate that this is a functional description and that software, hardware, or a combination of software and hardware can perform the respective functions. A unit, such as an electrical device, and electrical device control, a meter, a smart grid, a utility computing device, a vendor or manufacturer's computing device, etc., can be software, hardware, or a combination of software and hardware. The units can comprise the phase identification software 706 as illustrated in FIG. 7 and described below. In one exemplary aspect, the units can comprise a computing device 108 as referenced above and further described below.

FIG. 7 is a block diagram illustrating an exemplary operating environment for performing the disclosed methods. This exemplary operating environment is only an example of an operating environment and is not intended to suggest any limitation as to the scope of use or functionality of operating environment architecture. Neither should the operating environment be interpreted as having any dependency or requirement relating to any one or combination of components illustrated in the exemplary operating environment.

The present methods and systems can be operational with numerous other general purpose or special purpose computing system environments or configurations. Examples of well known computing systems, environments, and/or configurations that can be suitable for use with the systems and methods comprise, but are not limited to, personal computers, server computers, laptop devices, and multiprocessor systems. Additional examples comprise set top boxes, programmable consumer electronics, network PCs, minicomputers, mainframe computers, smart meters, smart-grid components, SCADA masters, distributed computing environments that comprise any of the above systems or devices, and the like.

The processing of the disclosed methods and systems can be performed by software components. The disclosed systems and methods can be described in the general context of computer-executable instructions, such as program modules, being executed by one or more computers or other devices. Generally, program modules comprise computer code, routines, programs, objects, components, data structures, etc. that perform particular tasks or implement particular abstract data types. The disclosed methods can also be practiced in grid-based and distributed computing environments where tasks are performed by remote processing devices that are linked through a communications network. In a distributed computing environment, program modules can be located in both local and remote computer storage media including memory storage devices.

Further, one skilled in the art will appreciate that the systems and methods disclosed herein can be implemented via a computing device 108. The components of the computing device 108 can comprise, but are not limited to, one or more processors or processing units 703, a system memory 712, and a system bus 713 that couples various system components including the processor 703 to the system memory 712. In the case of multiple processing units 703, the system can utilize parallel computing. In one aspect, the processor 703 is configured to send an actuation signal to cause an adjustment in the operational characteristics of an electrical device and receive information about changes in at least one electrical parameter of one or more phases of a poly-phase electrical system that provides electrical energy to the electrical device wherein the changes can be correlated with the adjustment of the one or more operational characteristics of the electrical device, thereby identifying the one or more phases of the poly-phase electrical system that provide electrical energy to the electrical device based upon the correlation of the changes in the at least one electrical parameter of the one or more phases of the poly-phase electrical system that provides electrical energy to the electrical device with the adjustment of the one or more operational characteristics of the electrical device.

The system bus 713 represents one or more of several possible types of bus structures, including a memory bus or memory controller, a peripheral bus, an accelerated graphics port, and a processor or local bus using any of a variety of bus architectures. By way of example, such architectures can comprise an Industry Standard Architecture (ISA) bus, a Micro Channel Architecture (MCA) bus, an Enhanced ISA (EISA) bus, a Video Electronics Standards Association (VESA) local bus, an Accelerated Graphics Port (AGP) bus, and a Peripheral Component Interconnects (PCI), a PCI-Express bus, a Personal Computer Memory Card Industry Association (PCMCIA), Universal Serial Bus (USB) and the like. The bus 713, and all buses specified in this description can also be implemented over a wired or wireless network connection and each of the subsystems, including the processor 703, a mass storage device 704, an operating system 705, phase identification software 706, phase identification data 707, a network adapter 708, system memory 712, an Input/Output Interface 710, a display adapter 709, a display device 711, and a human machine interface 702, can be contained within one or more remote computing devices or clients 714a, b,c at physically separate locations, connected through buses of this form, in effect implementing a fully distributed system or distributed architecture.

The computing device 108 typically comprises a variety of computer readable media. Exemplary readable media can be any available media that is non-transitory and accessible by the computing device 108 and comprises, for example and not meant to be limiting, both volatile and non-volatile media, removable and non-removable media. The system memory 712 comprises computer readable media in the form of volatile memory, such as random access memory (RAM), and/or non-volatile memory, such as read only memory (ROM). The system memory 712 typically contains data such as phase identification data 707 and/or program modules such as operating system 705 and phase identification software 706 that are immediately accessible to and/or are presently operated on by the processing unit 703. In one aspect, the system memory 712 contains computer executable codes sections for performing the steps of causing a signal to be transmitted to adjust one or more operational characteristics of an electrical device; receiving information about changes in at least one electrical parameter of one or more phases of a poly-phase electrical system that provides electrical energy to the electrical device; correlating the changes in the at least one electrical parameter of the one or more phases of the poly-phase electrical system that provides electrical energy to the electrical device with the adjustment of the one or more operational characteristics of the electrical device; and identifying the one or more phases of the poly-phase electrical system that provide electrical energy to the electrical device based upon the correlation of the changes in the at least one electrical parameter of the one or more phases of the poly-phase electrical system that provides electrical energy to the electrical device with the adjustment of the one or more operational characteristics of the electrical device.

In another aspect, the computing device 108 can also comprise other non-transitory, removable/non-removable, volatile/non-volatile computer storage media. By way of example, FIG. 7 illustrates a mass storage device 704 that can provide non-volatile storage of computer code, computer readable instructions, data structures, program modules, and other data for the computing device 108. For example and not meant to be limiting, a mass storage device 704 can be a hard disk, a removable magnetic disk, a removable optical disk, magnetic cassettes or other magnetic storage devices, flash memory cards, CD-ROM, digital versatile disks (DVD) or other optical storage, random access memories (RAM), read only memories (ROM), electrically erasable programmable read-only memory (EEPROM), and the like.

Optionally, any number of program modules can be stored on the mass storage device 704, including by way of example, an operating system 705 and phase identification software 706. Each of the operating system 705 and phase identification software 706 (or some combination thereof) can comprise elements of the programming and the phase identification software 706. Phase identification data 707 can also be stored on the mass storage device 704. Phase identification data 707 can be stored in any of one or more databases known in the art. Examples of such databases comprise, DB2® (IBM Corporation, Armonk, N.Y.), Microsoft® Access, Microsoft® SQL Server, (Microsoft Corporation, Bellevue, Wash.), Oracle®, (Oracle Corporation, Redwood Shores, Calif.), mySQL, PostgreSQL, and the like. The databases can be centralized or distributed across multiple systems.

In another aspect, the user can enter commands and information into the computing device 108 via an input device (not shown). Examples of such input devices comprise, but are not limited to, a keyboard, pointing device (e.g., a "mouse"), a microphone, a joystick, a scanner, tactile input devices such as gloves, and other body coverings, and the like These and other input devices can be connected to the processing unit 703 via a human machine interface 702 that is coupled to the system bus 713, but can be connected by other interface and bus structures, such as a parallel port, game port, an IEEE 1394 Port (also known as a Firewire port), a serial port, or a universal serial bus (USB).

In yet another aspect, a display device 711 can also be connected to the system bus 713 via an interface, such as a display adapter 709. It is contemplated that the computing device 108 can have more than one display adapter 709 and the computing device 108 can have more than one display device 711. For example, a display device can be a monitor, an LCD (Liquid Crystal Display), or a projector. In addition to the display device 711, other output peripheral devices can comprise components such as speakers (not shown) and a printer (not shown), which can be connected to the computer 108 via Input/Output Interface 710. Any step and/or result of the methods can be output in any form to an output device. Such output can be any form of visual representation, including, but not limited to, textual, graphical, animation, audio, tactile, and the like.

The computing device 108 can operate in a networked environment using logical connections to one or more remote computing devices or clients 714a,b,c. By way of example, a remote computing device 714 can be a personal computer, portable computer, a server, a router, a network computer, a smart meter, a vendor or manufacture's computing device, smart grid components, a SCADA master, a DRMS processor, a DMS processor, a peer device or other common network node, and so on. Logical connections between the computing device 108 and a remote computing device or client 714a,b,c can be made via a local area network (LAN) and a general wide area network (WAN). Such network connections can be through a network adapter 708. A network adapter 708 can be implemented in both wired and wireless environments. Such networking environments are conventional and commonplace in offices, enterprise-wide computer networks, intranets, and other networks 715 such as the Internet or an AMI network.

For purposes of illustration, application programs and other executable program components such as the operating system 705 are illustrated herein as discrete blocks, although it is recognized that such programs and components reside at various times in different storage components of the computing device 701, and are executed by the data processor(s) of the computer. An implementation of phase identification software 706 can be stored on or transmitted across some form of computer readable media. Any of the disclosed methods can be performed by computer readable instructions embodied on computer readable media. Computer readable media can be any available media that can be accessed by a computer. By way of example and not meant to be limiting, computer readable media can comprise "computer storage media" and "communications media." "Computer storage media" comprise volatile and non-volatile, removable and non-removable media implemented in any methods or technology for storage of information such as computer readable instructions, data structures, program modules, or other data. Exemplary computer storage media comprises, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

The methods and systems can employ Artificial Intelligence techniques such as machine learning and iterative learning. Examples of such techniques include, but are not limited to, expert systems, case based reasoning, Bayesian networks, behavior based AI, neural networks, fuzzy systems, evolutionary computation (e.g. genetic algorithms), swarm intelligence (e.g. ant algorithms), and hybrid intelligent systems (e.g. Expert inference rules generated through a neural network or production rules from statistical learning).

As described above and as will be appreciated by one skilled in the art, embodiments of the present invention may be configured as a system, method, or computer program product. Accordingly, embodiments of the present invention may be comprised of various means including entirely of hardware, entirely of software, or any combination of software and hardware. Furthermore, embodiments of the present invention may take the form of a computer program product on a computer-readable storage medium having computer-readable program instructions (e.g., computer software) embodied in the storage medium. Any suitable non-transitory computer-readable storage medium may be utilized including hard disks, CD-ROMs, optical storage devices, or magnetic storage devices.

Embodiments of the present invention have been described above with reference to block diagrams and flowchart illustrations of methods, apparatuses (i.e., systems) and computer program products. It will be understood that each block of the block diagrams and flowchart illustrations, and combinations of blocks in the block diagrams and flowchart illustrations, respectively, can be implemented by various means including computer program instructions. These computer program instructions may be loaded onto a general purpose computer, special purpose computer, or other programmable data processing apparatus, such as the one or more processors 703 discussed above with reference to FIG. 7 or the one or more processors 504 of FIG. 5, to produce a machine, such that the instructions which execute on the computer or other programmable data processing apparatus create a means for implementing the functions specified in the flowchart block or blocks.

These computer program instructions may also be stored in a computer-readable memory that can direct a computer or other programmable data processing apparatus (e.g., one or more processors 703 of FIG. 7 or the one or more processors 504 of FIG. 5) to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the flowchart block or blocks.

Accordingly, blocks of the block diagrams and flowchart illustrations support combinations of means for performing the specified functions, combinations of steps for performing the specified functions and program instruction means for performing the specified functions. It will also be understood that each block of the block diagrams and flowchart illustrations, and combinations of blocks in the block diagrams and flowchart illustrations, can be implemented by special purpose hardware-based computer systems that perform the specified functions or steps, or combinations of special purpose hardware and computer instructions.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

Throughout this application, various publications may be referenced. The disclosures of these publications in their entireties are hereby incorporated by reference into this application in order to more fully describe the state of the art to which the methods and systems pertain.

Many modifications and other embodiments of the inventions set forth herein will come to mind to one skilled in the art to which these embodiments of the invention pertain having the benefit of the teachings presented in the foregoing descriptions and the associated drawings. Therefore, it is to be understood that the embodiments of the invention are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method comprising:
adjusting one or more operational characteristics of an electrical device;
receiving information about changes in at least one electrical parameter of one or more phases of a poly-phase electrical system that provides electrical energy to the electrical device;
correlating the changes in the at least one electrical parameter of the one or more phases of the poly-phase electrical system that provides electrical energy to the electrical device with the adjustment of the one or more operational characteristics of the electrical device; and
identifying the one or more phases of the poly-phase electrical system that provide electrical energy to the electrical device based upon the correlation of the changes in the at least one electrical parameter of the one or more phases of the poly-phase electrical system that provides electrical energy to the electrical device with the adjustment of the one or more operational characteristics of the electrical device.

2. The method of claim 1, further comprising:
associating the identified one or more phases of the poly-phase electrical system that provide electrical energy to the electrical device to an electric meter associated with the electrical device.

3. The method of claim 1, wherein the one or more operational characteristics of the electrical device are adjusted using one or more of a demand response management system (DRMS), an advanced metering infrastructures (AMI) system, or an Internet connection.

4. The method of claim 1, wherein adjusting the one or more operational characteristics of the electrical device comprises causing the electrical device to draw higher current or operate at a higher voltage than its normal operating state or comprises causing the electrical device to draw lower current or operate at a lower voltage than its normal operating state.

5. The method of claim 1, wherein adjusting the one or more operational characteristics of the electrical device comprises cycling the electrical device on and off.

6. The method of claim 1, wherein adjusting the one or more operational characteristics of the electrical device comprises adjusting the operational characteristics of one or more of a heating, ventilation and air conditioning (HVAC) unit, a water heater, lighting, a dish washer, a refrigerator, a washing machine, a dryer, an electric stove or oven, or a microwave oven.

7. The method of claim 1, wherein adjusting the one or more operational characteristics of the electrical device comprises adjusting the one or more operational characteristics of the electrical device in a cyclic or repetitive pattern such that at least one electrical parameter of the one or more phases of a poly-phase electrical system that provides electrical energy to the electrical device is affected by the adjustment of the one or more operational characteristics of the electrical device and the at least one affected electrical parameter can be detected.

8. The method of claim 1, wherein adjusting the one or more operational characteristics of the electrical device is performed during off-peak hours for the poly-phase electrical system that provides electrical energy to the electrical device.

9. The method of claim 8, wherein the off-peak hours for the poly-phase electrical system that provides electrical energy to the electrical device are between 12:00 midnight and 4:00 a.m., local to a location of the electrical device.

10. The method of claim 1, wherein receiving information about changes in at least one electrical parameter of one or more phases of a poly-phase electrical system that provides electrical energy to the electrical device comprises receiving information about changes in at least one of voltage, current, resistance, frequency, capacitance, inductance, power factor, real power or reactive power of the one or more phases of the poly-phase electrical system that provides electrical energy to the electrical device.

11. The method of claim 1, wherein receiving information about changes in at least one electrical parameter of one or more phases of a poly-phase electrical system that provides electrical energy to the electrical device comprises receiving information from a supervisory control and data acquisition (SCADA) system.

12. The method of claim 1, wherein receiving information about changes in at least one electrical parameter of one or more phases of a poly-phase electrical system that provides electrical energy to the electrical device comprises receiving information about changes in at least one electrical parameter detected using a fast-Fourier transform (FFT) to detect the affected electrical parameters.

13. The method of claim 1, wherein receiving information about changes in at least one electrical parameter of one or more phases of a poly-phase electrical system that provides electrical energy to the electrical device comprises receiving information from a distribution management system (DMS).

14. The method of claim 1, wherein receiving information about changes in at least one electrical parameter of one or more phases of a poly-phase electrical system that provides electrical energy to the electrical device comprises receiving a respective phase identifier for each of the one or more phases of the poly-phase electrical system where a change in at least one electrical parameter is detected.

15. The method of claim 1, wherein correlating the changes in the at least one electrical parameter of the one or more phases of the poly-phase electrical system that provides electrical energy to the electrical device with the adjustment of the one or more operational characteristics of the electrical device comprises detecting changes in at least one of voltage, current, resistance, frequency, capacitance, inductance, power factor, real power or reactive power of the one or more phases of the poly-phase electrical system that provides electrical energy to the electrical device, wherein the detected changes can be correlated with the adjustment of the one or more operational characteristics of the electrical device.

16. The method of claim 1, wherein identifying the one or more phases of the poly-phase electrical system that provide electrical energy to the electrical device based upon the correlation of the changes in the at least one electrical parameter of the one or more phases of the poly-phase electrical system that provides electrical energy to the electrical device with the adjustment of the one or more operational characteristics of the electrical device comprises identifying the one or more phases of a three-phase electrical system that provide electrical energy to the electrical device based upon the correlation of the changes in the at least one electrical parameter of the one or more phases of the three-phase electrical system that provides electrical energy to the electrical device with the adjustment of the one or more operational characteristics of the electrical device.

17. A system comprised of:
a processor, wherein the processor is configured to:
cause a signal to be transmitted to adjust one or more operational characteristics of an electrical device;
receive information about changes in at least one electrical parameter of one or more phases of a poly-phase electrical system that provides electrical energy to the electrical device;
correlate the changes in the at least one electrical parameter of the one or more phases of the poly-phase electrical system that provides electrical energy to the electrical device with the adjustment of the one or more operational characteristics of the electrical device; and
identify the one or more phases of the poly-phase electrical system that provide electrical energy to the electrical device based upon the correlation of the changes in the at least one electrical parameter of the one or more phases of the poly-phase electrical system that provides electrical energy to the electrical device with the adjustment of the one or more operational characteristics of the electrical device.

18. The system of claim 17, further comprised of a database stored on a memory, wherein the processor is configured to associate the identified one or more phases of the poly-phase electrical system that provide electrical energy to the electrical device to an electric meter identifier that identifies an electric meter used to meter electric energy consumption of the electrical device and store the identified one or more phases of the poly-phase electrical system and the electric meter identifier in the database.

19. The method of claim 17, wherein the signal to adjust the one or more operational characteristics of the electrical device is transmitted via one or more of a demand response management system (DRMS), an advanced metering infrastructures (AMI) system, or an Internet connection.

20. The system of claim 17 further comprising an electrical device control, wherein the transmitted signal to adjust the one or more operational characteristics of the electrical device comprises causing the electrical device control to cause the electrical device to draw higher current or operate at a higher voltage than its normal operating state or comprises causing the electrical device to draw lower current or operate at a lower voltage than its normal operating state.

21. The system of claim 17 further comprising an electrical device control, wherein the transmitted signal to adjust the one or more operational characteristics of the electrical device comprises causing the electrical device control to cycle the electrical device on and off.

22. The system of claim 17, wherein the electrical device comprises one or more of a heating, ventilation and air conditioning (HVAC) unit, a water heater, lighting, a dishwasher, a refrigerator, a washing machine, a dryer, an electric stove or oven, or a microwave oven.

23. The system of claim 17, further comprising an electrical device control, wherein the transmitted signal to adjust the one or more operational characteristics of the electrical device comprises causing the electrical device control to adjust the one or more operational characteristics of the electrical device in a cyclic or repetitive pattern such that at least one electrical parameter of the one or more phases of a poly-phase electrical system that provides electrical energy to the electrical device is affected by the adjustment of the one or more operational characteristics of the electrical device and the at least one affected electrical parameter can be detected.

24. The system of claim 17, wherein the processor is configured to transmit the signal to adjust the one or more operational characteristics of the electrical device during off-peak hours for the poly-phase electrical system that provides electrical energy to the electrical device.

25. The system of claim 24, wherein the off-peak hours for the poly-phase electrical system that provides electrical energy to the electrical device are between 12:00 midnight and 4:00 a.m., local to a location of the electrical device.

26. The system of claim 17, wherein changes in at least one electrical parameter of one or more phases of a poly-phase electrical system that provides electrical energy to the electrical device comprises changes in at least one of voltage, current, resistance, frequency, capacitance, inductance, power factor, real power or reactive power of the one or more phases of the poly-phase electrical system that provides electrical energy to the electrical device.

27. The system of claim 17 further comprising a supervisory control and data acquisition (SCADA) system, wherein information about changes in the at least one electrical parameter of one or more phases of a poly-phase electrical system that provides electrical energy to the electrical device is received from the SCADA system.

28. The system of claim 27, wherein the SCADA system further comprises a SCADA processor and receiving information about changes in at least one electrical parameter of one or more phases of a poly-phase electrical system that provides electrical energy to the electrical device comprises receiving information about changes in at least one electrical parameter detected using a fast-Fourier transform (FFT) executing on the SCADA processor to detect the affected electrical parameters.

29. The system of claim 17 further comprising a distribution management system (DMS), wherein receiving information about changes in at least one electrical parameter of one or more phases of a poly-phase electrical system that provides electrical energy to the electrical device comprises receiving information from the DMS.

30. The system of claim 17, wherein receiving information about changes in at least one electrical parameter of one or more phases of a poly-phase electrical system that provides electrical energy to the electrical device comprises receiving a respective phase identifier for each of the one or more phases of the poly-phase electrical system where a change in at least one electrical parameter is detected.

31. The system of claim 17, wherein correlating the changes in the at least one electrical parameter of the one or more phases of the poly-phase electrical system that provides electrical energy to the electrical device with the adjustment of the one or more operational characteristics of the electrical device comprises detecting changes in at least one of voltage, current, resistance, frequency, capacitance, inductance, power factor, real power or reactive power of the one or more phases of the poly-phase electrical system that provides electrical energy to the electrical device, wherein the detected changes can be correlated with the adjustment of the one or more operational characteristics of the electrical device.

32. The system of claim 17, wherein identifying the one or more phases of the poly-phase electrical system that provide electrical energy to the electrical device based upon the correlation of the changes in the at least one electrical parameter of the one or more phases of the poly-phase electrical system that provides electrical energy to the electrical device with the adjustment of the one or more operational characteristics of the electrical device comprises identifying the one or more phases of a three-phase electrical system that provide electrical energy to the electrical device based upon the correlation of the changes in the at least one electrical parameter of the one or more phases of the three-phase electrical system that provides electrical energy to the electrical device with the adjustment of the one or more operational characteristics of the electrical device.

\* \* \* \* \*